(12) United States Patent
Sato

(10) Patent No.: US 11,567,128 B2
(45) Date of Patent: Jan. 31, 2023

(54) MEASUREMENT OF INTERNAL WIRE DELAY

(71) Applicant: Micron Technology, Inc., Boise, ID (US)

(72) Inventor: Toshiyuki Sato, Saitama (JP)

(73) Assignee: Micron Technology, Inc., Boise, ID (US)

(*) Notice: Subject to any disclaimer, the term of this patent is extended or adjusted under 35 U.S.C. 154(b) by 373 days.

(21) Appl. No.: 16/874,562

(22) Filed: May 14, 2020

(65) Prior Publication Data

US 2021/0356520 A1 Nov. 18, 2021

(51) Int. Cl.
*G01R 31/317* (2006.01)
*G01R 31/3177* (2006.01)

(52) U.S. Cl.
CPC ... *G01R 31/3177* (2013.01); *G01R 31/31701* (2013.01); *G01R 31/31708* (2013.01)

(58) Field of Classification Search
CPC ............... G01R 31/26; G01R 31/2642; G01R 31/2648; G01R 31/2831; G01R 31/31702
See application file for complete search history.

(56) References Cited

U.S. PATENT DOCUMENTS 8,531,225 B1 * 9/2013 Hussain ................. H03K 5/133
327/276
2016/0216313 A1 * 7/2016 Ogawa ............... G01R 31/2623

* cited by examiner

*Primary Examiner* — Tung X Nguyen
(74) *Attorney, Agent, or Firm* — Dorsey & Whitney LLP

(57) ABSTRACT

Semiconductor devices that include test circuitry to measure internal signal wire propagation delays during memory access operations, and circuity configured to store delay information that is used to configure internal delays based on the measured internal signal propagation circuit delays. The semiconductor device includes a test circuit configured to measure a signal propagation delay between a command decoder and a bank logic circuit based on time between receipt of a test command signal directly from the command decoder and a time of receipt of the test command signal routed through the bank logic circuit.

18 Claims, 4 Drawing Sheets

MEASUREMENT OF INTERNAL WIRE DELAY

BACKGROUND

High data reliability, high speed of memory access, low power, and reduced chip size are features that are demanded from semiconductor memory. Within a memory, relative timing may be important to ensure data is reliably transmitted from and received at a semiconductor device. Process, voltage, and/or temperature differences (PVT) may across semiconductor device may result in timing variance between semiconductor devices due to conductive properties of wire traces and transition speed of components on a device. For devices that operate more slowly, transmitted data may be unstable due to reduced timing margins, which may affect reliability of the device.

DETAILED DESCRIPTION

Figure 1:
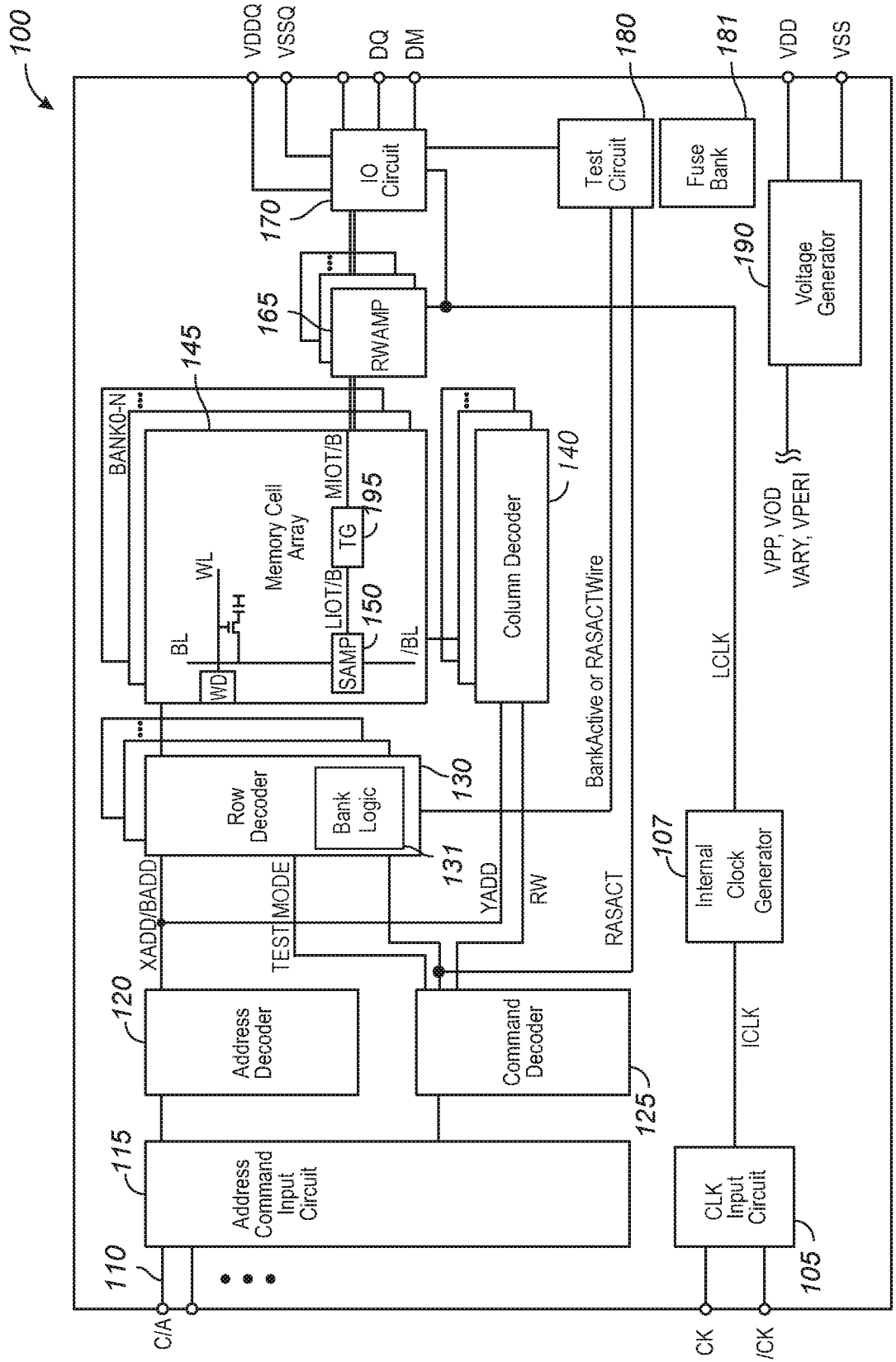
FIG. 1 illustrates a schematic block diagram of a semiconductor device in accordance with an embodiment of the present disclosure.

Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments.

This disclosure describes semiconductor devices that include circuitry to detect internal signal wire propagation delays (e.g., based on signal transmission or propagation timing, and component transition timing) during access operations, and circuity configured to store delay information that is used to control internal delays based on the detected internal circuit delays. Normally, during a memory access operation, a sequence of operations within the semiconductor device occur, with latter operations dependent on information from prior operations in the sequence. For example, in response to receipt of an activate command (ACT), a command decoder may provide a row address strobe (RAS) active signal RASACT (e.g., internal command signal) to hank logic circuitry (or a row decoder). The bank logic circuitry may provide a BankActive signal (e.g., read wordline active (RWLACT)) after a predetermined latency. After generation of the BankActive signal, a logic circuit (e.g., AND logic) evaluates bank address signals and the BankActive signal to activate a selected bank. Accordingly, when the selected bank is activated, other control signals may activate a row of memory cells to be accessed. Data read from the row of the memory cells may be sensed via sense amplifiers, and may be provided to input/output (I/O) circuitry (e.g., including buffers and drivers) coupled to respective data terminals DQ. The I/O circuitry may be configured to provide the read data to a data bus via the data terminals in response to control signals generated based on the ACT command.

In this example, the logic circuit is dependent on the BankActive signal being generated prior to evaluating the BankActive signal and the bank address signals. If the logic circuit is activated too early (e.g., before the BankActive signal is generated), the memory access operation may Conversely, if a delay is added prior to activation of the logic circuit, then downstream timing margins may be reduced.

The timing of the generation of the BankActive signal is based on a combination of a predetermined internal latency and a signal propagation delay (e.g., based on relative physical location of relevant circuits of the semiconductor device, and based on physical timing characteristics of the semiconductor device affected by PVT variations). The predetermined internal latency may be set according to an operational mode for compatible operation of the semiconductor device within an installed system. However, signal propagation delays may be measured and compensated for within the semiconductor device. For example, the memory array and the bank logic circuitry (e.g., including the logic circuit) may be physically located at one part of the silicon wafer, and the command decoder may be physically located at another part of the silicon wafer. The physical distance between the command decoder and the bank logic circuitry may be such that variance in the signal propagation delay between the command decoder and the bank logic circuitry caused by PVT differences among different devices may result in significant delay differences in high speed memory applications.

The semiconductor device may include a test circuit configured to determine the signal propagation delay and to configure the semiconductor device to adjust a delay prior to activation of the logic circuit based on the determined signal propagation delay. The test circuit may include a process monitor configured to measure signal delays. In an example, the semiconductor device may be placed in a first test mode to measure time between receipt of an activation command ACT and activation of the BankActive signal or a second test mode to measure the signal propagation delay. For example, while in the first test mode or the second test mode, the ACT command may be provided to the semiconductor device, and in response, the command decoder is configured to provide the RASACT signal (e.g., test command signal while in a test mode) to the bank logic circuitry (e.g., via a first bus) and to the test circuit (e.g., via a second bus) in response to the ACT command. In response to the RASACT signal, the counter of the test circuit is configured to begin counting oscillations of a clock signal (e.g., such as a dock signal provided by a ring oscillator of the test circuit).

The bank logic circuitry includes a multiplexer (e.g., or switch) that is configured to provided one of the BankActive signal (e.g., the first test mode) or the RASACT signal (e.g., the second test mode) to the test circuit (e.g., via a third bus). Thus, while in the first test mode, the bank logic circuitry may be configured to provide the BankActive signal to the test circuit. In response to receipt of the BankActive signal, the test circuit is configured to stop the counter and to provide a delay value based on a time between receipt of the RASACT signal and the BankActive signal (e.g., BankActive delay).

While in the second test mode, the bank logic circuitry may be configured to provide the RASACT signal received from the command decoder (RASACTWire) to the test circuit. In response to receipt of the RASACTWire signal, the test circuit is configured to stop the counter and to provide a delay value based on a time between receipt of the RASACT signal and the RASACTWire signal (e.g., a signal propagation delay). The test circuit may provide the delay value to a tester via a data terminal (DQ), in some examples. In some examples, the raw count value may be adjusted to determine the delay value. For example, the raw count value may be adjusted based on a difference between the distance from the command decoder and the bank logic circuitry and the distance between the bank logic circuitry and the test circuit. In an example, the distance between the command decoder and the bank logic may be approximately equal to the distance between the bank logic and the test circuit. As such, a raw count value in the second mode may indicate a propagation delay that is approximately twice as large as the propagation delay between the command decoder and the bank logic. Thus, for the second mode, the test circuit may divide the raw signal propagation delay count value in two to provide the delay value, in some examples. In other examples, the test circuit may provide the raw count value to the tester, and the tester may derive the delay value from the raw count value. Based on the determined signal propagation delay, the tester (or the test circuit) the tester may cause the semiconductor device to store a delay parameter that is indicative of the signal propagation delay, which may be used to adjust timing of internal circuitry of the bank logic. The delay parameter may be persistently stored in a programmable circuit, such as a fuse bank or an anti-fuse bank, in some examples. By individually configuring a delay value specific to physical characteristics of the semiconductor device, issues with early activation of the logic circuit and/or applying a longer-than-necessary delay may be avoided.

FIG. 1 illustrates a schematic block diagram of a semiconductor device 100 in accordance with an embodiment of the present disclosure. The semiconductor device 100 includes a memory die. The memory die may include a command/address input circuit 115, an address decoder 120, a command decoder 125, a clock input circuit 105, internal clock generator 107, row decoder 130, column decoder 140, a memory cell array 145, read/write amplifiers 165, an I/O circuit 170, a test circuit, and power circuit 190.

In some embodiments, the semiconductor device 100 may include, without limitation, a dynamic random-access memory (DRAM) device, such as double data rate (DDR) DDR4, DDR5, low power (LP) DDR, integrated into a single semiconductor chip, for example. The die may be mounted on an external substrate, for example, a memory module substrate, a mother board or the like. The semiconductor device 100 may further include a memory cell array 145. The memory cell array 145 includes a plurality of banks, each bank including a plurality of word lines WL, a plurality of bit lines BL (e.g., digit lines, access lines, data I/O lines, etc.), and a plurality of memory cells MC arranged at intersections of the plurality of word lines WL and the plurality of bit lines BL. The selection of the word line WL is performed by a row decoder 130 and the selection of the bit line BL (along with a column select signal CS) is performed by a column decoder 140. Sense amplifiers (SA) 150 are located near their corresponding bit lines BL and connected to at least one respective local I/O line based on the CS signal, which is in turn coupled to a respective one of at least two main I/O line pairs, via transfer gates (TG) 195, which function as switches.

In some embodiments, the memory cell array 145 may include memory array mats having respective digit lines and memory cells. The memory array mats may be separated by areas for control circuitry, including the sense amplifiers 150 connected to a respective subset (e.g., even or odd) bitlines of adjacent memory array mats to perform sense operations on corresponding memory cells.

The semiconductor device 100 may employ a plurality of external terminals that include address and command terminals coupled to command/address bus (C/A), clock terminals CK and/CK, data terminals DQ, DQS, and DM, power supply terminals VDD, VSS.

The command/address terminals may be supplied with an address signal and a bank address signal from outside via command/address bus 110. The address signal and the bank address signal supplied to the address terminals are transferred, via the command/address input circuit 115, to an address decoder 120. The address decoder 120 receives the address signal and decodes the address signal to provide decoded address signal ADD. The ADD signal includes a decoded row address signal and a decoded column address signal. The decoded row address signal is provided to the row decoder 130, and a decoded column address signal is provided to the column decoder 140. The address decoder 120 also receives the bank address signal and supplies the bank address signal to the row decoder 130, the column decoder 140.

The command/address terminals may further be supplied with a command signal from outside, such as, for example, a memory controller. The command signal may be provided, via the C/A bus, to the command decoder 125 via the command/address input circuit 115. The command decoder 125 decodes the command signal to generate various internal commands/signals that include a RASACT signal to select a word line and a column command signal Read/Write, such as a read command or a write command, to select a bit line, and a test mode signal.

Accordingly, when a read command is issued and a row address and a column address are timely supplied with the read command, read data is read from a memory cell in the memory cell array 145 designated by these row address and column address. The read data DQ is output to outside from the data terminals DQ (data), DQS (data strobe), and DM (data mask) via read/write amplifiers 165 and an input/output circuit 170. Similarly, when the write command is issued and a row address and a column address are timely supplied with this command, and then write data is supplied to the data terminals DQ, DQS, DM, the write data is received by data receivers in the input/output circuit 170, and supplied via the input/output circuit 170 and the read/write amplifiers 165 to the memory cell array 145 and written in the memory cell designated by the row address and the column address.

Normally, during a memory access operation, a sequence of operations within the semiconductor device 100 occur, with latter operations sometimes dependent on information from prior operations in the sequence. For example, in response to receipt of an activate command (ACT), a command decoder 115 may provide the RASACT signal (e.g., internal command signal) to bank logic circuitry 131 of the row decoder 130 (e.g., via a first bus). The bank logic circuitry 131 may provide a BankActive signal (e.g., read wordline active (RWLACT)) after a predetermined latency. After generation of the BankActive signal, a logic circuit (e.g., AND logic) of the bank logic circuitry 131 evaluates bank address signals and the BankActive signal to activate a selected memory bank BANK0-N. Accordingly, when the selected bank is activated, other control signals may activate a row of memory cells to be accessed. Data read from the row of the memory cells may be sensed via sense amplifiers 150, and may be provided to the IO circuit 170 (e.g., including buffers and drivers) via the read/write amplifiers 165. The IO circuit 170 may be configured to provide the read data to a data bus via the data terminals DQ in response to control signals generated based on the ACT command (e.g., such as the LCLK signal).

In this example, the logic circuit is dependent on the BankActive signal being generated prior to evaluating the BankActive signal and the bank address signals. If the logic circuit is activated too early (e.g., before the BankActive signal is generated), the memory access operation may fail. Conversely, if a delay is added prior to activation of the logic circuit, then downstream timing margins may be reduced.

The timing of the generation of the BankActive signal is based on a combination of a predetermined internal latency and signal propagation delays (e.g., based on relative physical location of relevant circuits of the semiconductor device 100, and based on physical timing characteristics of the semiconductor device 100 affected by PVT variations). The predetermined internal latency may be set according to an operational mode for compatible operation of the semiconductor device 100 within an installed system. However, signal propagation delays may be measured and compensated for within the semiconductor device 100. For example, the memory cell array 145 and the bank logic circuitry 131 (e.g., including the logic circuit) may be physically located at one part of the silicon wafer, and the command decoder 125 may be physically located at another part of the silicon wafer (e.g, a peripheral circuit area). The physical distance between the command decoder 125 and the hank logic circuitry 131 may be such that variance in the signal propagation delay between the command decoder 125 and the bank logic circuitry 131 may PVT differences between devices may result in significant delay differences in high speed memory applications.

The semiconductor device 100 may include a test circuit 180 configured to determine the signal propagation delay and to configure the semiconductor device 100 to adjust a delay prior to activation of the logic circuit of the bank logic circuitry 131 based on the determined signal propagation delay. In an example, the semiconductor device 100 may be placed in a first test mode to measure time between activation of the BankActive signal or a second test mode to measure the signal propagation delay. For example, the semiconductor device 100 may be placed in a first or second test mode via a command from a tester or host. The command decoder 125 may provide the test mode signal to the row decoder 130 indicating the test mode. While in the first test mode or the second test mode, an ACT command may be provided to the semiconductor device 100. The command decoder 125 may be configured to provide the RASACT signal (e.g., test command signal when in a test mode) to the bank logic circuitry 131 (e.g., via the first bus) and to the test circuit 180 (e.g., via a second bus) in response to the ACT command. In response to the RASACT signal, the test circuit 180 may start counting oscillations of a count clock (e.g., such as a count clock provided by a ring oscillator of the test circuit 180).

The bank logic circuitry 131 includes a multiplexer (e.g., or switch) that is configured to provided one of the BankActive signal (e.g., the first test mode) or the RASACTWire signal (e.g., the second test mode) to the test circuit 180 (e.g., via a third bus as a test command signal). Thus, while in the first test mode, the bank logic circuitry 131 may be configured to provide the BankActive signal to the test circuit 180. In response to receipt of the BankActive signal, the test circuit 180 is configured to stop counting oscillations of the count clock and to provide a delay value based on the count value to indicate a latency between provision of the RASACT signal and generation of the BankActive signal. While in the second test mode, the bank logic circuitry 131 may be configured to provide the RASACT signal received from the command decoder (RASACTWire) to the test circuit 180. In response to receipt of the RASACTWire signal, the test circuit 180 may be configured to stop counting oscillations of the count clock and to provide a delay value based on the count value to indicate a time between receipt of the RASACT signal and receipt of the RASACTWire signal (e.g., a signal propagation delay). The test circuit 180 may provide the delay value to a tester (not shown) via a data terminal (DQ), in some examples.

The raw count value may be based on the signal propagation path from the command decoder 125 to the bank logic circuitry 131 and the signal propagation path from the bank logic circuitry 131 to the test circuit 180. In some examples, the test circuit 180 may adjust the raw count value to determine the delay value. For example, the test circuit 180 may reduce the raw count value from the second mode to compensate for the additional delay path. The test circuit 180 may adjust the raw count value based on a difference between the distance from the command decoder 125 and the bank logic circuitry 131 and the distance between the bank logic circuitry 131 and the test circuit 180. In an example, the distance between the command decoder 125 and the bank logic circuit 131 may be approximately equal to the distance between the bank logic circuit 131 and the test circuit 180. In this example, the test circuit 180 may divide the raw count value by two to provide the delay value.

In other examples, the test circuit 180 may provide the raw count value as the delay value to the tester via the data terminal DQ, and the tester may compensate may process the raw count value to determine the signal propagation delay. Based on the determined signal propagation delay, the tester (or the test circuit 180) may cause the semiconductor device 200 to store a delay parameter that is used to select a delay value to be applied prior to activation of the logic circuit of the bank logic circuitry 131. The delay parameter may be persistently stored in a programmable circuit, such as a fuse bank 181 (or anti-fuse bank). By individually configuring a delay value specific to physical characteristics of the semiconductor device 100, issues with early activation of the logic circuit of the bank logic circuitry 131 and/or applying a longer-than-necessary delay may be avoided.

Turning to the explanation of the external terminals included in the semiconductor device 100, the clock terminals CK and/CK are supplied with an external clock signal and a complementary external clock signal, respectively. The external clock signals (including complementary external clock signal) may be supplied to a dock input circuit 105. The clock input circuit 105 may receive the external clock signals to generate an internal clock signal LCLK. The internal clock signal LCLK is supplied to an internal clock generator 107 and thus a phase controlled internal clock signal LCLK is generated based on the received internal clock signal LCLK. Although not limited thereto, a delaylocked loop (DLL) circuit, a duty cycle correction (DCC) circuit, or a combination thereof may be used as the internal clock generator 107. The phase controlled internal clock signal LCLK may be used as a timing signal for determining an output timing of read data.

The power supply terminals are supplied with power supply potentials VDD and VSS. These power supply potentials VDD2 and VSS are supplied to the power circuit 190. The power circuit 190 generates various internal potentials VKK, VARY, VPERI, and the like based on the power supply potentials VDD2 and VSS. The internal potential VKK is mainly used in the row decoder 130, the internal potential VARY are mainly used in the sense amplifiers included in the memory cell array 145, and the internal potential VPERI is used in many other circuit blocks.

The power supply terminals are also supplied with power supply potentials VDDQ and VSSQ. These power supply potentials VDDQ and VSSQ are supplied to the input/output circuit 170. The power supply potentials VDDQ and VSSQ are typically the same potentials as the power supply potentials VDD2 and VSS, respectively. However, the dedicated power supply potentials VDDQ and VSSQ are used for the input/output circuit 170 so that power supply noise generated by the input/output circuit 170 does not propagate to the other circuit blocks.

Figure 2:
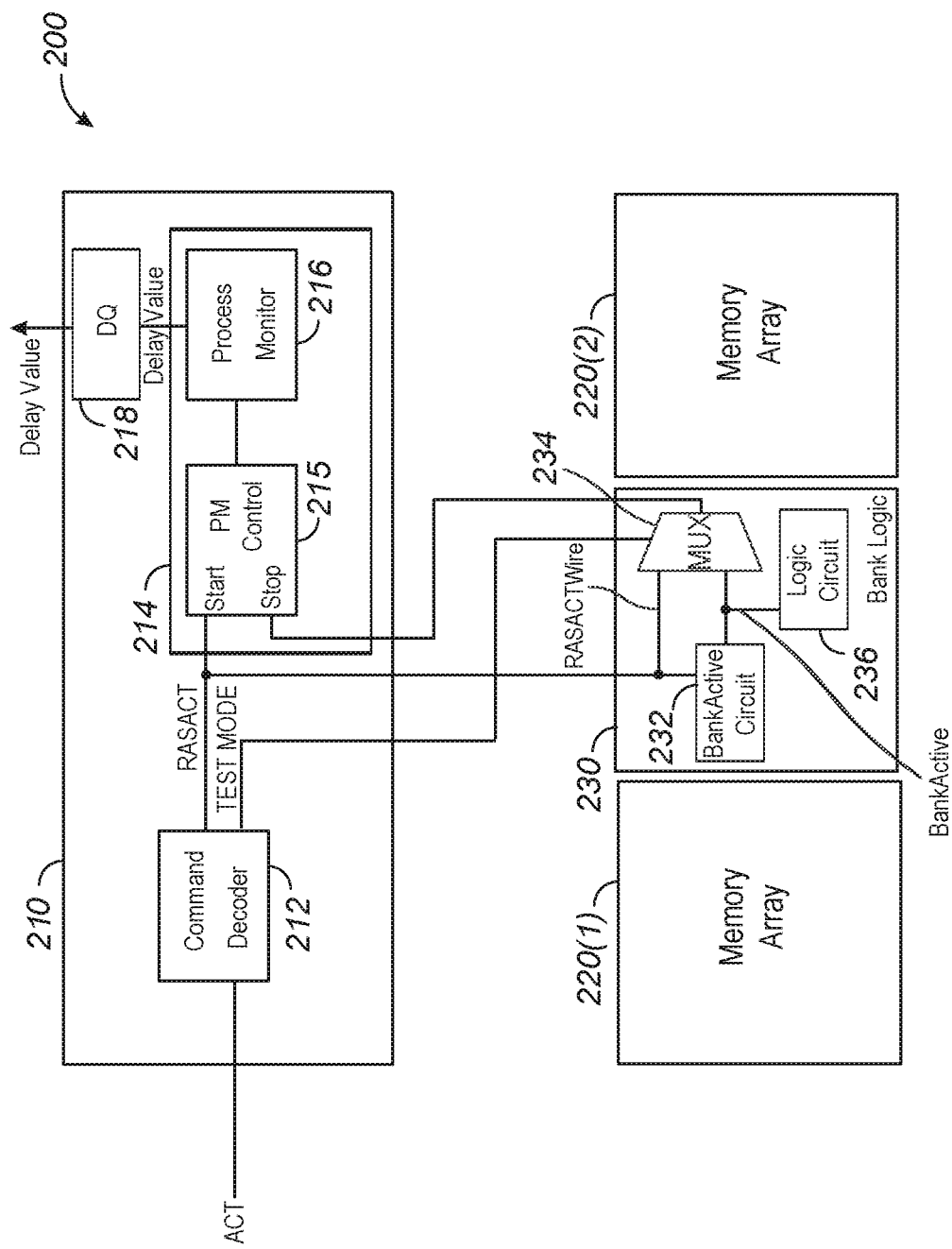
FIG. 2 illustrates a schematic block diagram of a portion of a memory array in accordance with an embodiment of the disclosure.

FIG. 2 illustrates a block diagram of a portion of a semiconductor device 200 in accordance with an embodiment of the disclosure. The semiconductor device 200 includes an peripheral circuit area 210 having a command decoder 212, a test circuit 214, and a data terminal DQ 218, memory arrays 220(1)-(2), and bank logic 230. The semiconductor device 100 of FIG. 1 may implement the semiconductor device 200.

The peripheral circuit area 210 may include circuitry of the semiconductor device 200 configured to interface with external buses coupled to the semiconductor device, and may be physically located on a different part of the semiconductor device 200 than the memory arrays 220(1)-(2) and the bank logic 230. The command decoder 212 may be configured to receive an ACT command from a command and address bus, and to provide a RASACT signal (e.g., test command signal) to the test circuit 214 (via a first bus) and the bank logic 230 (e.g., via a second bus). The command decoder 212 may also be configured to provide a test mode signal to the bank logic 230. The test mode may be stored in a mode register of the command decoder 212, and may be set by a host or tester coupled to the semiconductor device 200. The test circuit 214 may include a process monitor controller 215 coupled to a process monitor 216.

The process monitor controller 215 may be configured to receive the RASACT signal. (e.g., a pulse), and may provide a start control signal to the process monitor 216. In response to the start control signal, the process monitor 216 may start counting of oscillations of a counter clock. In some examples, the counter clock may be generated by a ring oscillator of the process monitor 216. The process monitor controller 215 may receive one of a BankActive signal or a RASACTWire signal from the bank logic 230 (e.g., via a third bus as a test command signal) and may provide a stop control signal to the process monitor 216 in response to the BankActive signal or the RASACTWire signal. In response to the stop control signal, the process monitor 216 may stop counting oscillations of the counter clock, and may process the count value to provide a delay value to the data terminal DQ 218 for provision to the tester or host.

The bank logic 230 may include a BankActive circuit 232 coupled to a multiplexer 234 and a logic circuit 236. The BankActive circuit 232 and the multiplexer 234 (second input) may receive the RASACT signal from the command decoder 212. In addition, the multiplexer 234 may receive a test mode signal from the command decoder 212 to control operation of the multiplexer 234. The BankActive circuit 232 may generate a BankActive signal based on the RASACT signal, and may provide the BankActive signal to the multiplexer 234 (first input) and the logic circuit 236. The logic circuit 236 may initiate activation of a bank of one of the memory arrays 220(1)-(2) based on received hank address signals (not shown) and the BankActive signal. Based on a value of the test mode signal, the multiplexer 234 may selectively provide one of the BankActive signal or the RASACWire signal (RASACTWire) received from the command decoder command decoder 212 to the test circuit 214. For example, in response to the test mode signal having a first value, the multiplexer 234 may provide the BankActive signal to the test circuit 214. In response to the test mode signal having a second value, the multiplexer 234 may provide the RASACTWire signal to the test circuit 214.

In operation, during a memory access operation, a sequence of operations within the semiconductor device 200 occur, with latter operations sometimes dependent on information from prior operations in the sequence. For example, in response to receipt of an ACT command, the command decoder 212 may provide the RASACT signal to the bank logic 230. The BankActive circuit 232 of the bank logic 230 may generate a BankActive signal (e.g., read wordline active (RWLACT)) after a predetermined latency. Based on the BankActive signal and bank address signals, the logic circuit 236 (e.g., AND logic) may activate a memory bank of the memory arrays 220(1)-(2).

However, in this example, while the logic circuit 236 is dependent on the BankActive signal being generated prior to evaluating the BankActive signal and the bank address signals, operation of logic circuits of the logic circuit 236 may be triggered by another signal. Thus, if the logic circuit 236 is activated too early (e.g., before the BankActive signal is generated), the memory access operation may fail. Conversely, if a delay is added prior to activation of the logic circuit 236, then downstream timing margins for memory access operations may be reduced.

The timing of the generation of the BankActive signal is based on a combination of a predetermined internal latency and a signal propagation delay (e.g., based on relative physical location of relevant circuits of the semiconductor device 200, and based on physical timing characteristics of the semiconductor device 200 affected by PVT variations). The predetermined internal latency may be set according to an operational mode for compatible operation of the semiconductor device 200 within an installed system. The signal propagation delays may be measured and compensated for within the semiconductor device 200, in some examples. For example, the memory arrays 220(1)-(2) and the bank logic 230 may be physically located at one part of the silicon wafer, and the peripheral circuit area 210 may be physically located at another part of the semiconductor device 200. The physical distance between the peripheral circuit area 210 and the bank logic 230 may be such that variance in the signal propagation delay between the command decoder command decoder 212 and the bank logic 230 caused by PVT differences among difference devices may result in significant propagation delay differences in high speed memory applications.

The test circuit 214 may be configured to determine the signal propagation delay, which may be used to configure the semiconductor device 200 to adjust a delay prior to activation of the logic circuit 236 based on the determined signal propagation delay. The semiconductor device 200 may be placed in a first test mode to measure time between activation of the BankActive signal or a second test mode to measure the signal propagation delay. For example, while in the first test mode or the second test mode, an ACT command is provided to the command decoder 212. The command decoder 212 is configured to provide the RASACT signal to the bank logic 230 and to the test circuit 214 in response to the ACT command. In response to the RASACT signal, the process monitor controller 215 is configured to provide a start control signal to the process monitor 216. In response to the start control signal, the process monitor 216 is configured to begin counting oscillations of a counter clock (e.g., such as a counter clock provided by a ring oscillator of the test circuit 214).

The multiplexer 234 may be configured to selectively provide one of the BankActive signal (e.g., the first test mode) from the BankActive circuit 232 or the RASACTWire signal (e.g., the second test mode) to the test circuit 214. Thus, while in the first test mode, the multiplexer 234 may be configured to provide the BankActive signal to the test circuit 214. In response to receipt of the BankActive signal, the process monitor controller 215 is configured to provide a stop control signal to the process monitor 216. In response to the stop control signal, the process monitor 216 is configured to stop counting and to process the count value to provide a delay value indicative of a time between receipt of the RASACT signal and receipt of the BankActive signal (e.g., BankActive delay). While in the second test mode, the multiplexer 234 may be configured to provide the RASACT signal received from the command decoder 212 (RASACTWire) to the test circuit 214. In response to receipt of the RASACTWire signal, the process monitor controller 215 is configured to provide a stop control signal to the process monitor 216. In response to the stop control signal, the process monitor 216 is configured to stop counting and to process the count value to provide a delay value indicative of a time between receipt of the RASACT signal and receipt of the RASACTWire signal (e.g., a signal propagation delay). The process monitor 216 may provide the delay value to a tester (not shown) via the data terminal DQ 218, in some examples.

In some examples, the raw count value may be based on the signal propagation path from the command decoder 212 to the bank logic 230 and the signal propagation path from the bank logic 230 to the test circuit 214. In some examples, the process monitor 216 may adjust the raw count value to determine the delay value. For example, the process monitor 216 may reduce the raw count value from the second mode to compensate for the additional delay path. The process monitor 216 may adjust the raw count value based on a difference between the distance from the command decoder 212 and the bank logic circuit 230 and the distance between the bank logic circuit 230 and the test circuit 214. In an example, the distance between the command decoder 212 and the bank logic circuit 230 may be approximately equal to the distance between the bank logic circuit 230 and the test circuit 214. In this example, the process monitor 216 may divide the raw count value by two to provide the delay value.

In other examples, the process monitor 216 may provide the raw count value as the delay value to the tester via the data terminal DQ 218, and the tester may compensate may process the raw count value to determine the signal propagation delay. Based on the determined signal propagation delay, the tester (or the command decoder 212) may cause the semiconductor device 200 to store a delay parameter that is used to select a delay value to be applied prior to activation of the logic circuit 236 of the bank logic 230. The delay parameter may be persistently stored in a programmable circuit (not shown), such as a fuse bank or an anti-fuse bank. By individually configuring a delay value specific to physical characteristics of the semiconductor device 200, issues with early activation of the logic circuit 236 of the bank logic 230 and/or applying a longer-than-necessary delay may be avoided.

Figure 3:
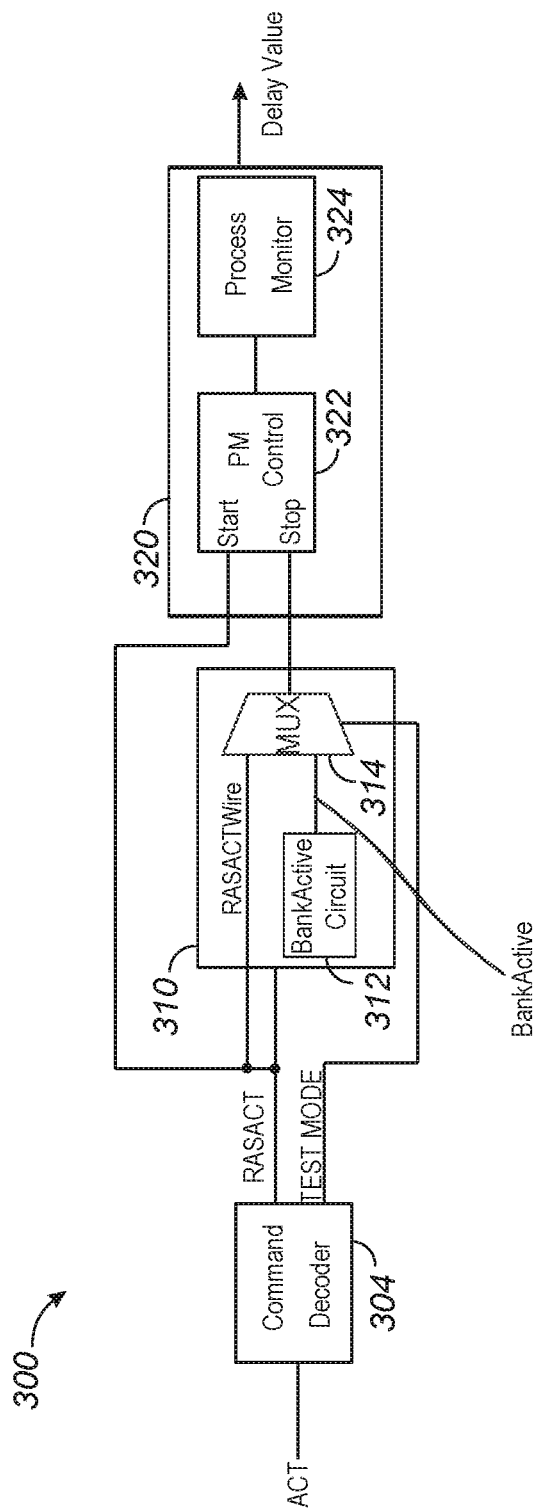
FIG. 3 illustrates a schematic block diagram of a portion of a memory array in accordance with an embodiment of the disclosure.

FIG. 3 illustrates a block diagram of a portion of a semiconductor device 300 in accordance with an embodiment of the disclosure. The semiconductor device 300 includes a command decoder 304, a bank logic 310, and a test circuit 320. The semiconductor device 100 of FIG. 1 and/or the semiconductor device 200 of FIG. 2 may implement the semiconductor device 300.

The command decoder 304 may be configured to receive an ACT command from a command and address bus, and to provide a RASACT signal (e.g., internal command signal while in normal operation mode and test command signal while in a test operation mode) to the bank logic 310 (e.g., via a first bus) and the test circuit 320 (e.g., via a second bus) in response to the ACT command. The command decoder 304 may also be configured to provide a test mode signal to the bank logic 310 to indicate a test mode of the semiconductor device 300. The test mode may be stored in a mode register of the command decoder 304, and may be set by a host or tester coupled to the semiconductor device 300.

The bank logic 310 may include a BankActive circuit 312 coupled to a multiplexer 314. The BankActive circuit 312 and the multiplexer 314 (first input) may receive the RASACT signal from the command decoder 304. In addition, the multiplexer 314 may receive a test mode signal from the command decoder 304 to control operation of the multiplexer 314. The BankActive circuit 312 may generate a BankActive signal based on the RASACT signal, and may provide the BankActive signal to the multiplexer 314 (second input) and a logic circuit (not shown), which may initiate activation of a bank of a memory array based on received bank address signals (not shown) and the BankActive signal. Based on a value of the test mode signal, the multiplexer 314 may selectively provide one of the BankActive signal or the RASACTWire signal to the test circuit 320. For example, in response to the test mode signal having a first value, the multiplexer 314 may provide the BankActive signal to the test circuit 320 (e.g., via a third bus). In response to the test mode signal having a second value, the multiplexer 314 may provide the RASACTWire signal to the test circuit 320 (e.g., via the third bus).

The test circuit 320 may include a process monitor controller 322 coupled to a process monitor 324. The process monitor controller 322 may be configured to receive the RASACT signal (e.g., a pulse), and may provide a start control signal to the process monitor 324. In response to the start control signal, the process monitor 324 may start counting of oscillations of a counter clock in response to the RASACT signal. In some examples, the counter clock may be generated by a ring oscillator of the process monitor 324. The process monitor controller 322 may receive one of a BankActive signal or the RASACTWire signal from the multiplexer 314 and may provide a stop control signal to the process monitor 324. In response to the stop control signal, the process monitor 324 may stop counting oscillations of the counter clock. The process monitor 324 may process the count value and provide a delay value for provision to a tester or host.

In operation, during a memory access operation, a sequence of operations within the semiconductor device 300 occur, with latter operations sometimes dependent on processing of information from prior operations in the sequence being completed. For example, in response to receipt of an ACT command, the command decoder 304 may provide the RASACT signal to the bank logic 310. The BankActive circuit 312 may generate a BankActive signal (e.g., read wordline active (RWLACT)) after a predetermined latency for use to activate a memory bank of a memory array.

Thus, if the BankActive signal is not generated prior to consumption of the BankActive signal, the memory access operation may fail. If a delay is added to ensure the BankActive circuit 312 has sufficient time to generate the BankActive signal, then downstream timing margins for memory access operations may be reduced.

The timing of the generation of the BankActive signal is based on a combination of a predetermined internal latency and signal propagation delays (e.g., based on relative physical location of relevant circuits of the semiconductor device 300, and based on physical timing characteristics of the semiconductor device 300 affected by PVT variations. The predetermined internal latency may be set according to an operational mode for compatible operation of the semiconductor device 300 within an installed system. However, signal propagation delays are device-specific and may be measured and compensated for within the semiconductor device 300.

Figure 4A:
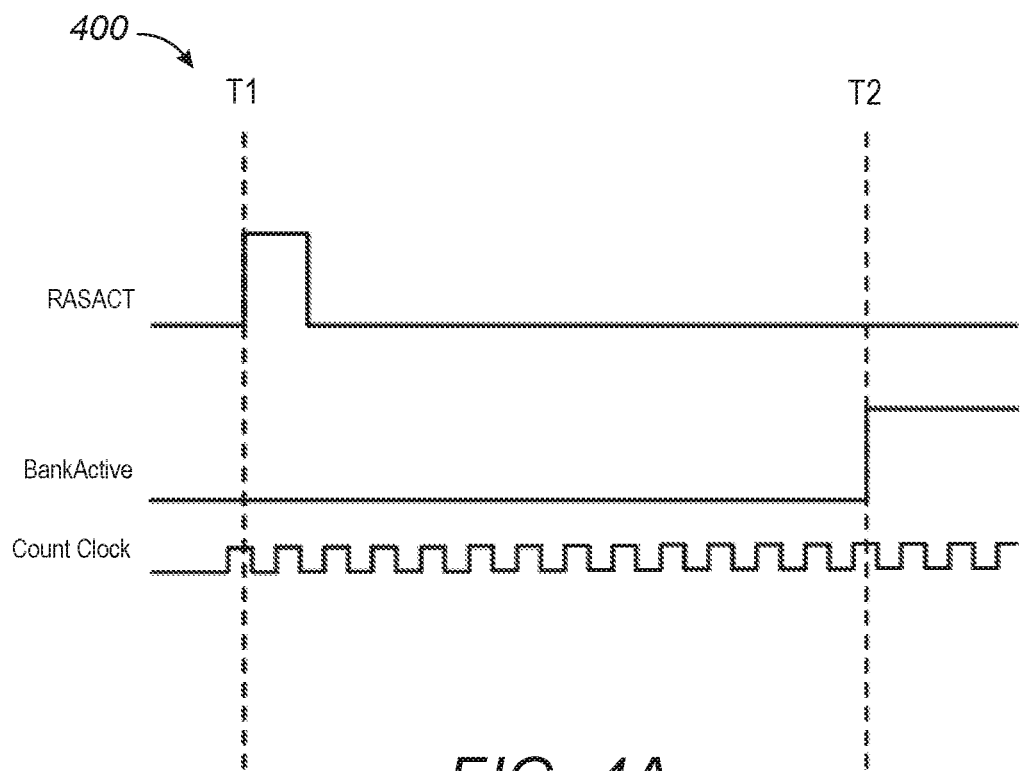
FIG. 4a depicts an exemplary timing diagram showing first test mode signal timing to measure a latency between receipt of the RASACT signal from a command decoder at a test circuit and receipt of a BankActive signal from bank logic at the test circuit, in accordance with an embodiment of the disclosure.

As an example, FIG. 4a depicts an exemplary timing diagram 400 showing first test mode signal timing to measure a latency between receipt of the RASACT signal from the command decoder 304 at the test circuit 320 and receipt of the BankActive signal from the bank logic 310 at the test circuit 320, in accordance with an embodiment of the disclosure. The semiconductor device 300 may be set to a first test mode or a second test mode based on a value of the test mode signal. At time T1, the test circuit 320 may receive the RASACT signal from the command decoder 304 at time T1. In response to receipt of the RASACT signal, the process monitor controller 322 may provide a start control signal to the process monitor 324. In response to the start control signal, the process monitor 324 may start counting the counter clock oscillations. While in the first test mode (e.g., the test mode signal having a first value), the multiplexer 314 may provide the BankActive signal to the test circuit 320. Thus, at time T2, the test circuit 320 may receive the BankActive signal from the multiplexer 314, and in response, the process monitor controller 322 may provide a stop control signal to the process monitor 324. In response to the stop control signal, the process monitor 324 may stop counting the clock oscillations and may process a count value to provide a delay value indicative of the BankActive signal latency. The time between T1 and T2 indicating the BankActive signal latency includes the predetermined latency plus signal propagation delay. PVT variance may result in signal propagation delay differences among semiconductor devices, which may result in significant delay differences in high speed memory applications.

Figure 4B:
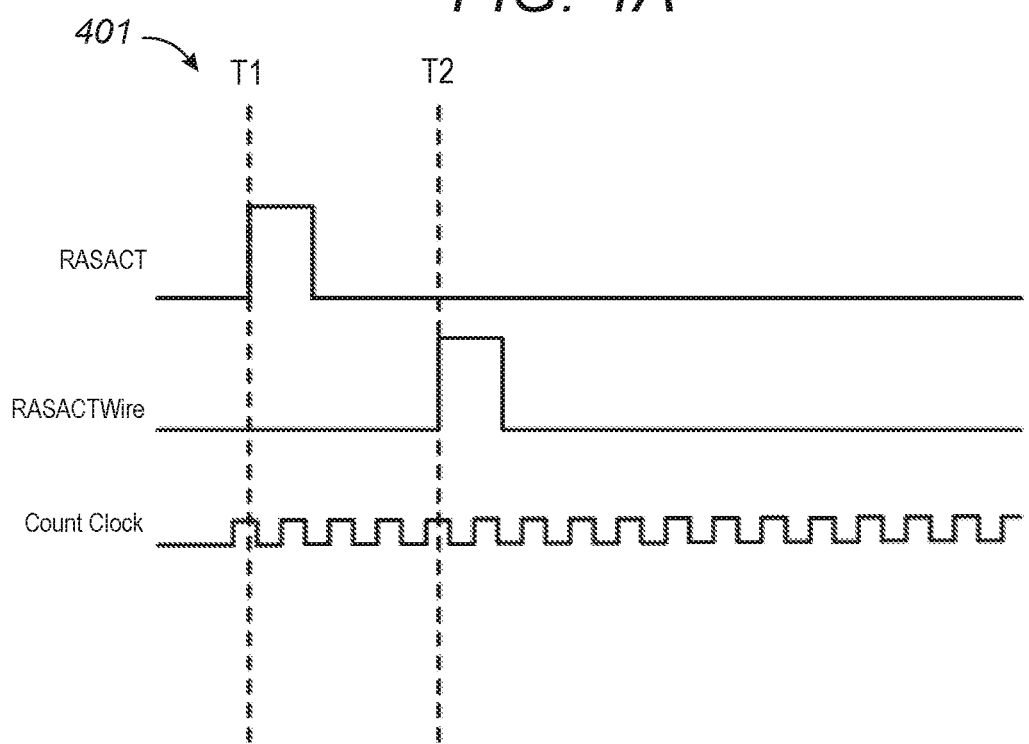
FIG. 4b depicts an exemplary timing diagram 401 showing second test mode signal timing to measure signal propagation delay between receipt of the RASACT signal from a command decoder at a test circuit and receipt of the RAS-ACTWire signal from bank logic at the test circuit, in accordance with an embodiment of the disclosure.

FIG. 4b depicts an exemplary timing diagram 401 showing second test mode signal timing to measure signal propagation delay between receipt of the RASACT signal from the command decoder 304 at the test circuit 320 and receipt of the RASACTWire signal from the bank logic 310 at the test circuit 320, in accordance with an embodiment of the disclosure. At time T1, the test circuit 320 may receive the RASACT signal from the command decoder 304. In response to receipt of the RASACT signal, the process monitor controller 322 may provide a start control signal to the process monitor 324. In response to the start control signal, the process monitor 324 may start counting the counter clock oscillations. While in the second test mode (e.g., the test mode signal having a second value), the RASACTWire signal may be routed through the bank logic 310 and may be provided to the test circuit 320 via the multiplexer 314. Thus, at time T2, the test circuit 320 may receive the RASACTWire signal from the multiplexer 314, and in response, the process monitor controller 322 may provide a stop control signal to the process monitor 324. In response to the stop control signal, the process monitor 324 may stop counting the clock oscillations and may process a count value to provide a delay value indicative of the signal propagation delay. The time between T1 and T2 indicates a signal propagation delay.

The process monitor 324 may set the delay value as the raw count value, in some examples. In other examples, the process monitor 324 may derive the delay value from the raw count value. The signal propagation paths from the command decoder 304 to the bank logic 310 and from the bank logic 310 to the test circuit 320 may result in the raw count value indicating propagation delays that are larger than (e.g., approximately double) the signal propagation delay from the command decoder 304 to the test circuit 320. In some examples, the process monitor 324 may adjust the raw count value to determine the delay value. For example, the process monitor 324 may reduce the raw count value from the second mode to compensate for the additional delay path. The process monitor 324 may adjust the raw count value based on a difference between the distance from the command decoder 304 and the bank logic circuit 310 and the distance between the bank logic circuit 310 and the test circuit 320. In an example, the distance between the command decoder 304 and the bank logic circuit 310 may be approximately equal to the distance between the bank logic circuit 310 and the test circuit 320. In this example, the process monitor 324 may divide the raw count value by two to provide the delay value. In other examples, the tester may convert the raw count value to a delay value.

Based on the determined signal propagation delay, the tester (or the test circuit 320) may configure the semiconductor device 300 to store a delay parameter that is used to select a delay value to be used during memory access operations. The delay parameter may be persistently stored in a programmable circuit (not shown), such as a fuse bank or an anti-fuse bank. By individually configuring a delay value specific to physical characteristics of the semiconductor device 300, memory access operation failures may be reduced.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:
1. An apparatus comprising:
a memory cell array;
a bank logic circuit arranged adjacent to the memory cell array; and
a peripheral circuit arranged away from each of the memory cell array and the bank logic circuit, wherein the peripheral circuit includes a command decoder connected to the bank logic circuit via a first bus and a test circuit connected to the command decoder via the second bus;

wherein, while in a test operation mode, the command decoder is configured to transfer a test command signal to the test circuit by way of the second bus;

wherein, while in the test operation mode, the test circuit is configured to determine a delay value based on a time difference between receipt of the test command signal received from the command decoder via a third bus and the test command signal received via the second bus.

2. The apparatus of claim 1, wherein the command decoder is further configured to transfer an internal command signal to the bank logic circuit with the first bus while in a normal operation mode.

3. An apparatus comprising:
a memory cell array;
a bank logic circuit arranged adjacent to the memory cell array; and
a peripheral circuit arranged away from each of the memory cell array and the bank logic circuit, wherein the peripheral circuit includes a command decoder connected to the bank logic circuit via a first bus and a test circuit connected to the command decoder via the second bus;
wherein, while in a test operation mode, the command decoder is configured to transfer a test command signal to the test circuit by way of the second bus;
wherein the command decoder is further configured to transfer an internal command signal to the bank logic circuit with the first bus while in a normal operation mode;
wherein the bank logic circuit comprises a logic circuit configured to cause activation of a bank of a memory array in response to the internal command signal while in the normal operation mode.

4. The apparatus of claim 1, wherein, while in the test operation mode, the test circuit comprises a process monitor configured to start counting oscillations of a count clock in response to receipt of the test command signal received via the second bus and to stop counting oscillations of the count clock in response to receipt of the test command signal received via the third bus, wherein the delay value is based on the count value.

5. The apparatus of claim 4, wherein the test circuit comprises a ring oscillator configured to provide the count clock.

6. The apparatus of claim 4, wherein, while in the test operation mode, the process monitor is configured to provide the delay value as half of the count value.

7. The apparatus of claim 1, wherein the test circuit is configured to provide the delay value to indicate an internal signal propagation delay between the command decoder and the bank logic circuit when the output signal is the RAS-ACTWire signal.

8. The apparatus of claim 1, wherein the bank logic circuit include a multiplexer configured to selectively provide one of the an internal command signal or the test command signal as the output signal based on whether a mode of operation is a normal operation mode or a test operation mode.

9. The apparatus of claim 1, further comprising a fuse bank or an anti-fuse bank configured to store a delay parameter based on the delay value in response to a program command.

10. The apparatus of claim 1, further comprising a data terminal configured to provide the delay value to a data bus.

11. An apparatus comprising:
a test circuit configured to measure a signal propagation delay between a command decoder and a bank logic circuit based on time between receipt of a test command signal directly from the command decoder and a time of receipt of the test command signal routed through the bank logic circuit.

12. The apparatus of claim 11, wherein the test circuit configured to measure the signal propagation delay by counting oscillations of a count clock from a time at which the test command signal is received to a time at which the test command signal routed through the bank logic circuit is received to provide a count value, wherein the signal propagation delay is based on the count value.

13. The apparatus of claim 10, wherein the test circuit is configured to adjust the count value based on difference between a first distance between the command decoder and the bank logic circuit and a second distance between the bank logic circuit and the test circuit to measure the signal propagation delay.

14. The apparatus of claim 10, wherein the test circuit is configured to divide the count value by two to measure the signal propagation delay.

15. A method comprising:
while in a test mode:
providing a test command signal to a bank logic circuit and to a test circuit of the semiconductor device;
providing, from the bank logic circuit, the test command signal to the test circuit;
determining a delay value based on a time between receipt of the test command signal from the command decoder and receipt of the test command signal from the bank logic circuit; and
providing the delay value at an output of the semiconductor device.

16. The method of claim 15, further comprising counting oscillations of a count clock from the time of receipt of the test command signal from the command decoder to receipt of the test command signal from the bank logic circuit, wherein the delay value is based on the count value.

17. The method of claim 16, further comprising adjusting the count value to determine the delay value based on a difference between a first distance between the command decoder and the bank logic circuit and a second distance between the bank logic circuit and the test circuit.

18. The method of claim 16, further comprising dividing the count value by two to determine the delay value.

* * * * *